United States Patent [19]

Mizutani et al.

[11] Patent Number: 4,748,333
[45] Date of Patent: May 31, 1988

[54] SURFACE DISPLACEMENT SENSOR WITH OPENING ANGLE CONTROL

[75] Inventors: Hideo Mizutani, Tokyo; Shoji Ishizaka, Kawasaki; Takeshi Suto, Funabashi, all of Japan

[73] Assignee: Nippon Kogaku K. K., Tokyo, Japan

[21] Appl. No.: 30,076

[22] Filed: Mar. 25, 1987

[30] Foreign Application Priority Data

Mar. 31, 1986 [JP] Japan .................................. 61-74020
Jun. 19, 1986 [JP] Japan ................................. 61-144340

[51] Int. Cl.[4] ............................................. G01V 9/04
[52] U.S. Cl. ........................................ 250/561; 356/4
[58] Field of Search ................ 250/560, 561; 356/381, 356/376, 1, 4

[56] References Cited

U.S. PATENT DOCUMENTS 4,373,816 2/1983 Laib ..................................... 356/381
4,589,773 5/1986 Ido et al. ............................. 356/376
4,647,209 3/1987 Neukomm et al. ................. 356/376

FOREIGN PATENT DOCUMENTS 56-42205 4/1981 Japan .

Primary Examiner—David C. Nelms
Assistant Examiner—Jessica L. Ruoff
Attorney, Agent, or Firm—Shapiro and Shapiro

[57] ABSTRACT

A surface displacement sensor is so designed that a stop or aperture for controlling an angle of opening is disposed at the position of a pupil of a detection optical system in which a slit image is focused on the surface to be detected and the light rays reflected from the surface to be detected are collected to re-focus the slit image on the light receiving surface of the sensor. When the height position of the surface to be detected is detected by such stop for controlling the angle of opening, the deviation of the distribution of intensity of light which tends to occur in the widthwise direction of the slit through which passes the light beam which in turn focuses a slit image, can be positively decreased by limiting the angle of opening N.A. in the widthwise direction of the slit for passing the light beam to focus a slit image to be narrow and consequently the degree of detection accuracy can be improved. The stop for controlling the angle of opening is so designed and constructed that in the case of detecting operation of the sensor, the angle of opening N.A. in the widthwise direction of the slit image is limited so that the slit image having a sufficiently narrow angle of opening can be obtained. Furthermore, in the case of the focal point adjustment of the optical system, the stop is so switched that a slit image having a sufficiently wide angle of opening N.A. in the widthwise direction thereof can be focused on a receiving slit. The focal point adjustment is further facilitated in the surface displacement sensor.

6 Claims, 9 Drawing Sheets

F I G. 1
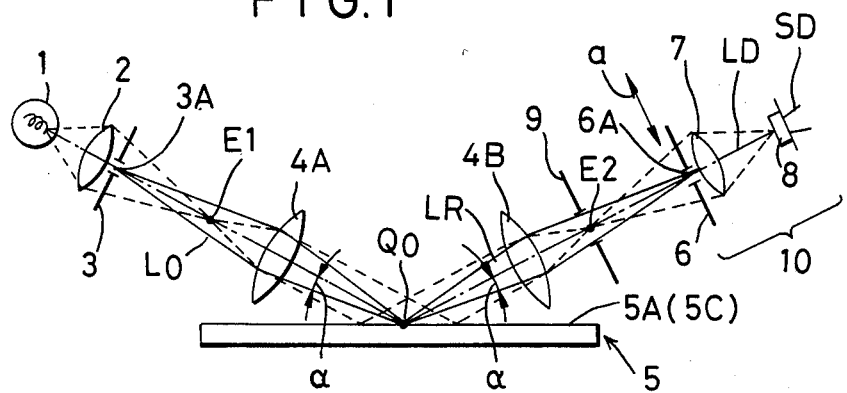
F I G. 2
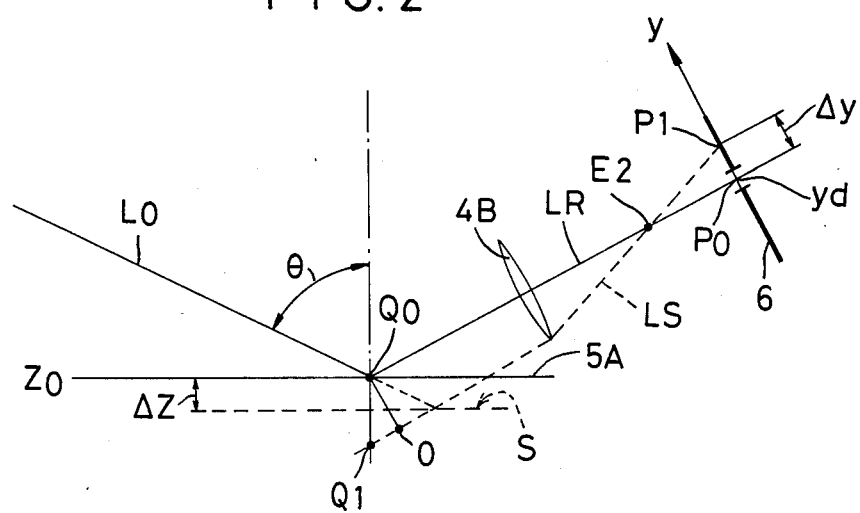

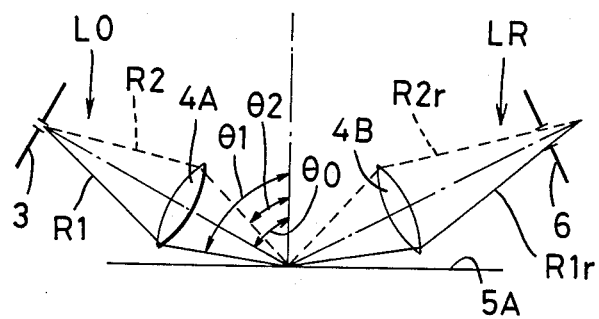
FIG. 6
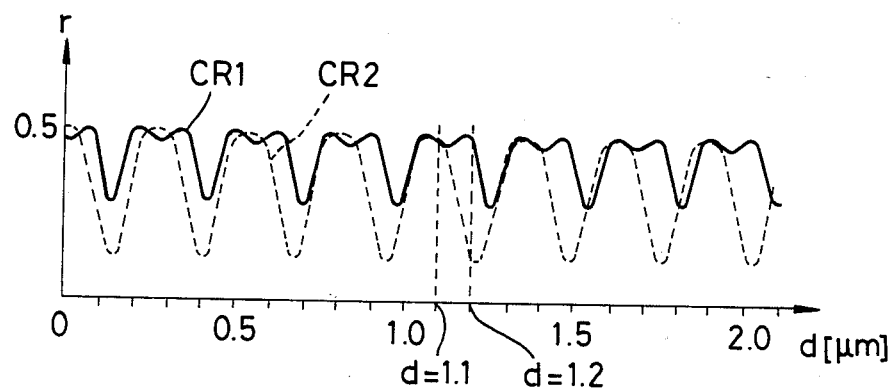
FIG. 7
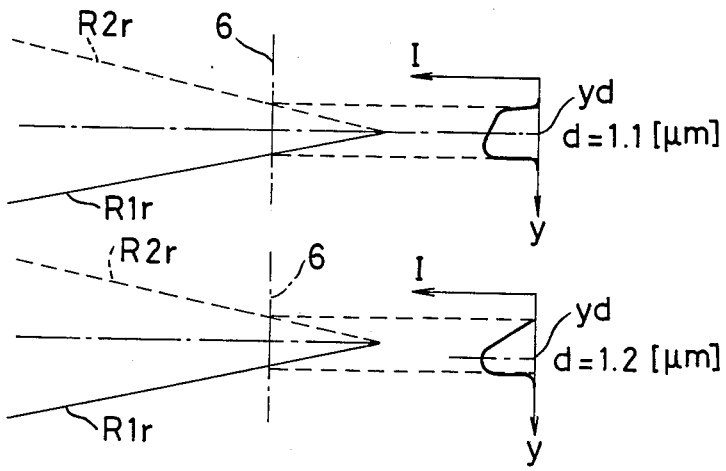
FIG. 8A
FIG. 8B

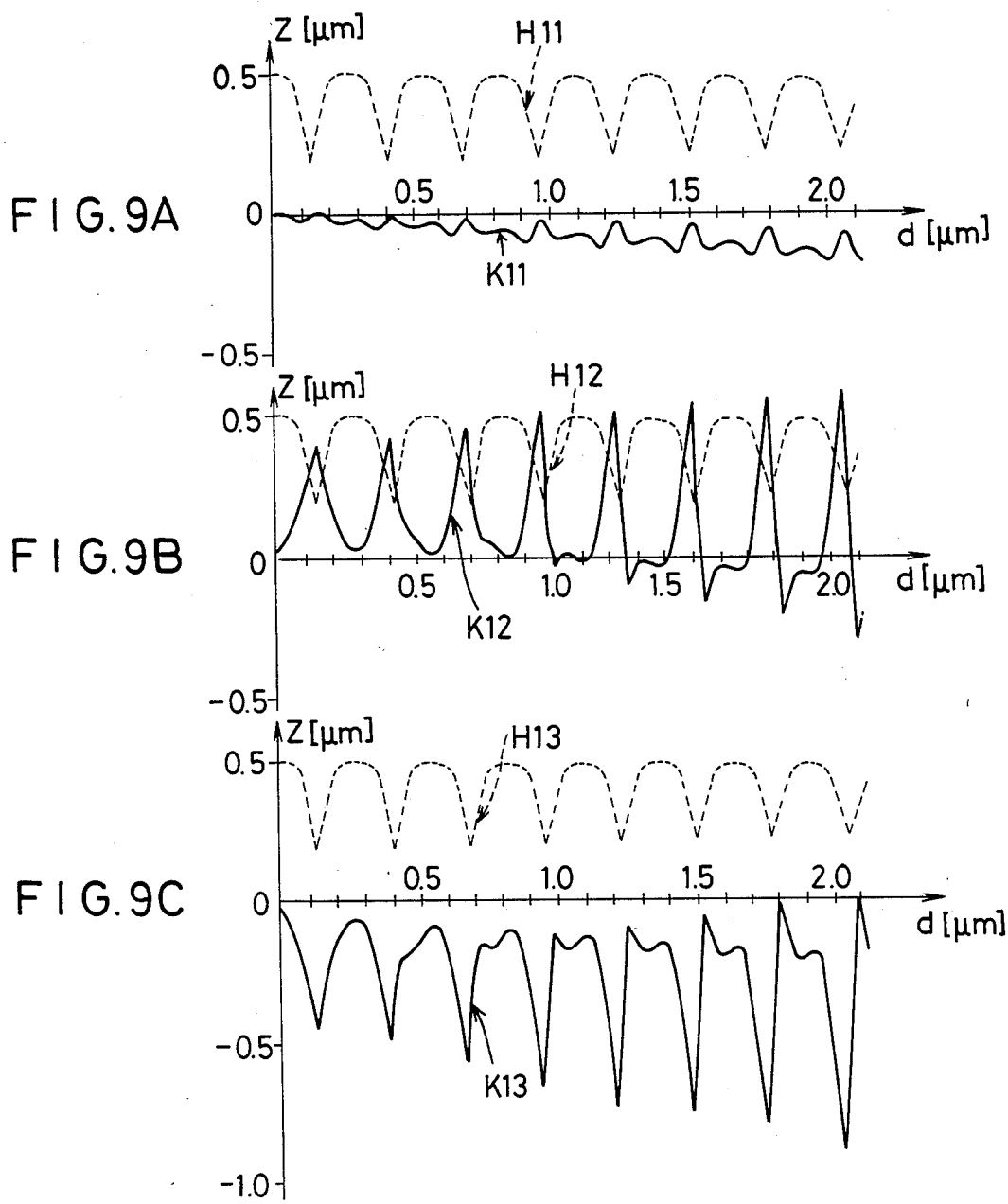

N.A = 0.025 × 0.1    λ = 600 ~ 800 nm

SURFACE DISPLACEMENT SENSOR WITH OPENING ANGLE CONTROL

BACKGROUND OF THE INVENTION

1. Field of the Invention

The present invention relates to a sensor for sensing the surface displacement of an object to be inspected and more particularly a surface displacement sensor best adapted for use in focused position sensors of semiconductor device fabrication apparatus.

2. Related Background Art

So far as a focused point sensor in semiconductor device fabrication apparatus, there has been used an oblique incidence type focused position sensor of the type in which, as disclosed in detail in Laid-Open Japanese Patent Application No. 42205/1981, detection radiation is projected obliquely on the surface of a semiconductor wafer disposed at a position at which a mask pattern is transfered through a projection lens and in response to the reflected detection radiation, the positional displacement of the surface of the semiconductor with respect to a focused position is detected.

In the focused-position detection sensor of the type described, a slit-shaped radiation beam is projected on the surface of a semiconductor wafer which is to be detected and the reflected radiation beam is re-focused on a sensor including a photoelectric transducer and disposed in a photodetector or light receiving unit, whereby the position of the image re-focused on the sensor is detected.

When the surface of the semiconductor wafer which is to be detected is displaced vertically (in the direction of the optical axis of the projection lens), whether or not the surface of the wafer is located at the focused portion (reference position) with respect to the projection lens of the semiconductor fabrication apparatus based on the fact that in response to the vertical displacement of the surface of the wafer, the incident radiation beam on the sensor is caused to be displaced in a lateral direction in the direction perpendicular to the direction of incidence and then the lateral displacement is detected.

However, it was found out that the position detection accuracy is limited in the case of the detection of the position of the surface of the semiconductor wafer by the conventional oblique incidence type focused-position sensor of the type described above. In addition, it was also found out that when the re-focused image on the sensor by the reflected radiation beam from the surface to be detected is defocused, an error is introduced in the result of the position detection obtained by the sensor.

SUMMARY OF THE INVENTION

In view of the above, the primary object of the present invention is to provide a surface displacement sensor which can substantially overcome the above and other problems encountered in the conventional surface displacement sensors and which the accuracy of the result of the detection of the position by the reflected radiation beam can be remarkably improved as compared with the conventional surface displacement sensors.

A second object to the present invention is to improve the surface displacement sensors in such a way that the interference of radiation reflected from a surface to be detected upon which the detection radiation is projected will not adversely affect the accuracy at which the surface position is detected.

A third object of the present invention is to provide a surface displacement sensor which is simple in construction yet capable of detecting the displacement of the surface to be detected at a high degree of accuracy without being adversely influenced by the interference of the radiation which is varied in response to the thickness of a thin film coated over the surface to be detected.

In order to overcome the above and other problems encountered in the conventional surface displacement sensors, various causes thereof were extensively studied. In general, the surfaces of the semiconductor wafers are coated with a thin film such as photoresist and in this case, it was found out that the interference between the radiation beam reflected from the surface of the thin film and the radiation beam which is transmitted through the thin film and is reflected from the surface of the semiconductor wafer affects the distribution of intensity of the radiation beam incident on the sensor in the direction perpendicular to the optical axis of an optical system for detecting the reflected radiation beam incident on the sensor. Furthermore it was found out that when the image of the slit re-focused on the sensor is de-focused, an error is introduced into the result of detection due to the above-described interference of the reflected radiation beams.

Meanwhile, materials composed of organic compounds such as photoresists have a relatively high degree of transmissivity in the case of a wavelength longer than photosensitive wavelengths, so that the interference tends to occur very frequently. As a result, in the case of the conventional sensors of the type using a light source emitting light at such wavelength, it is extremely difficult to improve the accuracy of detection of the position.

Moreover, when the thickness (in the same direction as the direction in which a surface to be detected is displaced) of the thin film is varied, the intensity of the reflected radiation beam incident on the sensor is periodically varied so that such periodical variations are introduced as errors in the results of the detection of the positions of the surfaces to be detected. Especially, the detection radiation which is projected over the surface of a semiconductor wafer to focus the image of a slit has an angle of opening N.A., so that the angle of incidence of each light ray of the detection radiation which focuses the slit image is different from each other so that the conditions of interference between the reflected light rays within the thin photoresist film are different from each other. Therefore, it is considered that when the slit image re-focused on the sensor is de-focused, errors are introduced in the position detection signal derived from the sensor.

Therefore, in order to attain the above and other objects, according to the present invention, in a detection optical system in which a slit image is focused on the surface to be detected and the light rays reflected from the surface to be detected are collected to re-focus the slit image on the light receiving surface of the sensor, a stop or aperture for controlling an angle of opening is disposed at the position of its pupil. Therefore, when the height position of the surface to be detected is detected by such stop for controlling the angle of opening, the deviation of the distribution of intensity of light which tends to occur in the widthwise direction of the slit through which passes the light beam which in turn focuses a slit image, can be positively decreased by limiting the angle of opening N.A. in the widthwise direction of the slit for passing the light beam to focus a slit image to be narrow and consequently the degree of detection accuracy can be improved.

The stop for controlling the angle of opening is so designed and constructed that in the case of detecting operation of the sensor, the angle of opening N.A. in the widthwise direction of the slit image is limited so that the slit image having a sufficiently narrow angle of opening can be obtained. Furthermore, in the case of the focal point adjustment of the optical system, the stop is so switched that a slit image having a sufficiently wide angle of opening N.A. in the widthwise direction thereof can be focused on a receiving slit. Thus, the present invention can provide a surface displacement sensor in which the focal point adjustment is further facilitated.

Furthermore, when the multicolor light beam is used as the detection radiation which is projected on the surface to be detected which is coated with a thin film which permits the transmission and reflection of light rays, interference between light rays reflected from the thin film can be reduced to a minimum so that a degree of accuracy at which the displacement of a surface is detected can be considerably improved as compared with the conventional surface displacement sensors.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 1 is a schematic view illustrating an optical system of a first embodiment in accordance with the present invention;

FIG. 2 is a view used to explain the mode of operation thereof;

FIG. 6 is a view used to explain the detection radiation having a wide angle of opening N.A. and the reflected light beam;

FIG. 7 show the characteristic curves illustrating that the energy reflectivities of two beams whose angles of reflection as shown in FIG. 6 are greatly different from each other are deviated depending upon the thickness of a thin photoresist film coated over the surface to be detected;

FIGS. 8A and 8B are views used to explain the deviation of the distribution of the intensity of light over a sensor in the de-focused state due to the energy reflectivities of the two beams shown in FIG. 7, FIG. 8A illustrating the distribution of intensity of light when the photoresist film is 1.1 micrometers in thickness while FIG. 8B illustrating the distribution of intensity of light in the case of a photoresist film 1.2 micrometers in thickness;

FIGS. 9A, 9B and 9C show characteristic curves illustrating the deviations in the cases of detection of the surfaces with respect to the thickness of the photoresist films when the stop for controlling the angle of opening shown in FIG. 1 is switched to the optical system adjustment mode (N.A.=0) so as to detect the positions of the surfaces; FIG. 9A showing the characteristic curve obtained when a slit image is sharply focused on the surface of the sensor; FIG. 9B illustrating the characteristic curves obtained when a slit image is de-focused in the front focus state; and FIG. 9C illustrating the characteristic curves obtained when a slit image is also de-focused in the rear focus state;

DESCRIPTION OF THE PREFERRED EMBODIMENTS

Figures 3, 4:
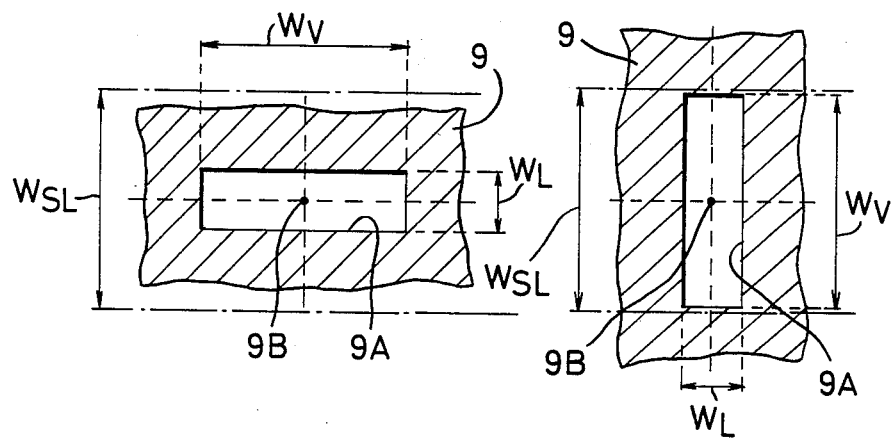
FIGS. 3 and 4 are top views of a stop for controlling the angle of opening used in the first embodiment shown in FIG. 1, FIG. 3 illustrating the state in the case of the detection of the position in which the widthwise direction of the opening coincides with that of a slit image while FIG. 4 illustrating the state in the case of the adjustment of the focal point of the optical system in which the longitudinal direction of the opening is perpendicular to the widthwise direction of the slit image.

FIG. 1 shows the construction of an optical system of a first embodiment of a surface displacement sensor in accordance with the present invention. Projection light LO emitted from a light source 1 is a monochromatic light which passes through a condenser lens 2 and illuminates a slit 3. The slit 3 has a rectangular slit opening 3A elongated in the direction perpendicular to FIG. 1. Projection light LO which has passes through the opening 3A is projected through an objective lens 4A on the side of light transmission over a surface 5A of a semiconductor wafer 5 (which is a surface to be detected), whereby an optical image of the slit opening 3A is focused. A light beam LR reflected from the surface 5A of the semiconductor wafer 5 is re-focused through an objective lens 4B on the light receiving side on a light receiving slit 6. The light beam which has passes through a slit-shaped opening 6A of the light receiving slit 6 as a detection light beam LD is collected on a sensor element 8 such as a photoelectric transducer through a collector lens 7. The light receiving slit 6, collector lens 7 and the photodetector 8 constitute a sensor unit 10.

The longitudinal direction of the slit-shaped opening 6A of the light receiving slit 6 is so determined to coincide with the longitudinal direction of the slit image focused on the surface 5A (that is, in the direction perpendicular to FIG. 1) and the light-receiving slit 6 is so designed and constructed that it oscillates at a predetermined amplitude in the direction perpendicular to the slit-shaped opening 6A. Therefore, the distribution of intensity of the slit-shaped image focused on the light receiving surface of the light receiving slit 6A is detected by the sensor element 8 and is derived as a detection output SD. In FIG. 1, the light rays indicated by the broken lines represent those in conjugated relationship with the light source 1 while the light rays indicated by the solid lines are those in conjugated relationship with the slit-shaped opening 3A. The position $E_1$ of the entrace pupil of the objective lens 4A on the side of light projection and the position $E_2$ of the exit pupil of the objective lens 4B on the light receiving side are in conjugated relationship with respect to the light source 1.

FIG. 2 is a view used to explain the relationship between the projected light beam LO and the reflected light beam LR when the surface (that is, the surface to be detected) 5A of the wafer 5 is displaced. The positions of the object lenses 4A and 4B of the optical system are so determined that when the surface 5A of the wafer 5 is located at a reference position or height Zo as indicated by the solid lines in FIG. 2, the reflected light beam LR is incident at a reference point Po of the light-receiving slit 6. When the reflected light beam LR is incident at the reference position Po, the light-receiving slit 6 oscillates about the reference point Po at a period T so that the intensity of light incident on the sensor element varies sinusoidally at a period of about ½T. As a result, the detection output SD in the sine waveform at a period ½T is derived from the sensor element 8 of the sensor unit 10. The detection output SD is synchronously detected so that when the reflected light beam LR is displaced in a direction perpendicular to the direction of incidence, the detection output representative of this position displacement can be obtained. Thus, the position of the surface 5A (that is, the surface to be detected) of the semiconductor wafer 5 can be detected in response to the detection output from the sensor element 8.

For instance, it is assumed that the surface 5A of the semiconductor wafer 5 is displaced downwardly by a distance $\Delta Z$ as indicated by the broken lines S in FIG. 2 (the surface 5 or the surface to be detected being assumed to be a mirror surface), the projection light beam LO focuses a slit image as a mirror image (virtual image) at a position $Q_1$ when looked from the light receiving side and the chief ray of this image crosses at a point $P_1$ displaced by $\Delta y$ from the reference position Po on the light receiving slit 6. Then the displacement $\Delta y$ of the position $P_1$ is in conjugated relationship with the light beam LS reflected from the displaced surface S with respect to the perpendicular QO drawn from the point Qo. Therefore the displacement $\Delta y$ on the light receiving slit 6 is expressed by $$\Delta y = 2 \cdot \beta \cdot \Delta Z \cdot \sin \theta \qquad (1)$$

where $\beta$ is the magnification of the image focused by the objective lens 4B on the light receiving side; and $\theta$ is the angle of incidence of the projection light beam LO incident on the surface 5A.

Therefore, when the displacement $\Delta y$ is on the light receiving slit 6 is detected in response to the detection output SD derived from the sensor element 8, the displacement $\Delta Z$ of the surface 5A of the conductor wafer 5 from the above-described Eq. (1).

In practice, the slit image focused on the opening 6A of the light-receiving slit 6 has a width substantially conjugate with the slit-shaped opening 3A. Therefore, the detection signal SD is computed by an arithmetic operation means (not shown) for obtaining the center of gravity of the quantity of light in the widthwise direction of the slit image so that the center of gravity of the quantity of light of the slit image is determined as a detected position $y_d$.

In addition, a stop 9 for controlling the angle of opening is interposed between the objective lens 4B on the light receiving side and the light receiving slit 6 so that the slit image is focused on the light-receiving slit 6 while the angle of opening N.A. in the widthwise direction of the slit of the slit reflecting light beam LR is limited to a predetermined narrow value.

In this specification, the angle of opening N.A. is defined as a sine of a half field angle $\alpha$ of an image focusing light beam in the direction in which the reflected light beam LR is displaced in the sensor unit 10 when the surface to be detection is displaced; that is, $$N.A. = \sin \alpha \qquad (2)$$

As is apparent from the light beam indicated by the broken lines in FIG. 1, the stop 9 for controlling the angle of opening is disposed at a position substantially conjugate with the light source 1; that is, the position of the exit pupil of the objective lens 4B (or the position of the entrace pupil of the object lens 4A) or at a position adjacent thereto.

In the case of the first embodiment, as shown in FIGS. 3 and 4, the stop 9 for controlling the angle of opening is so designed and constructed that it can rotate about 90° about the center 9B of a stop opening 9A. In the case of the detection mode for detecting the position of the surface 5A of the semiconductor wafer 5, the stop 9 is rotated in such a way that, as best shown in FIG. 3, the direction of the stop width $W_L$ of the stop opening 9 is made in coincidence with the direction of the width $W_{SL}$ of the reflected light beam LR (that is, the widthwise direction of the slit-shaped opening 3A of the slit 3). In this case, the angle of opening N.A. of the light beam which passes through the stop opening 9A of the stop 9 for controlling the angle of opening and falls on the light-receiving slit 6 in the sensor unit 10 is restricted to a sufficiently small value which in turn is determined depending on the stop width $W_L$ of the stop opening 9A. As a result, of the reflected light LR incident on the objective lens 4B, the light beam incident on the light receiving slit 6 has the angle of opening in the widthwise direction of the slit which is limited to a sufficiently small value.

When the angle of opening N.A. in the widthwise direction of the slit is limited to such small value as described above and when a thin transparent photoresist film is formed over the surface of the semiconductor wafer 5 because of the reason to be described in more detail hereinafter, detection errors due to interference between the reflected light rays can be decreased to a sufficiently small value in practice. On the other hand, in the case of the adjustment of the focal point of the optical system in which the reflected light rays LR are collected on the light receiving slit 6, the stop 9 for controlling the angle of opening is rotated from the position as shown in FIG. 3 through 90° about the center point 9B as shown in FIG. 4 so that the direction of the width Wv in the longitudinal direction of the aperture stop 9 of the stop for controlling the angle of opening is made in coincidence with the widthwise direction of the opening 3A of the slit 3. As a result, the angle of opening N.A. in the widthwise direction of the slit for the reflected light beam LR can be switched to a sufficiently wide value so that the depth of focus can be determined to have a sufficiently small value and consequently the adjustment of the focal point can be much facilitated.

As described above, in the case of the detection mode for detecting the position of the surface 5A or the surface to be detected as shown in FIG. 1, the stop 9 for controlling the angle of opening is rotated in the direction shown in FIG. 3 so that the angle of opening N.A. in the widthwise direction of the slit for the reflected light beam is restricted to a sufficiently narrow value in practice so that adverse effects caused by interference at the surface to be detected can be effectively avoided and consequently the displacement detection results with minimum errors can be obtained.

Figure 5:
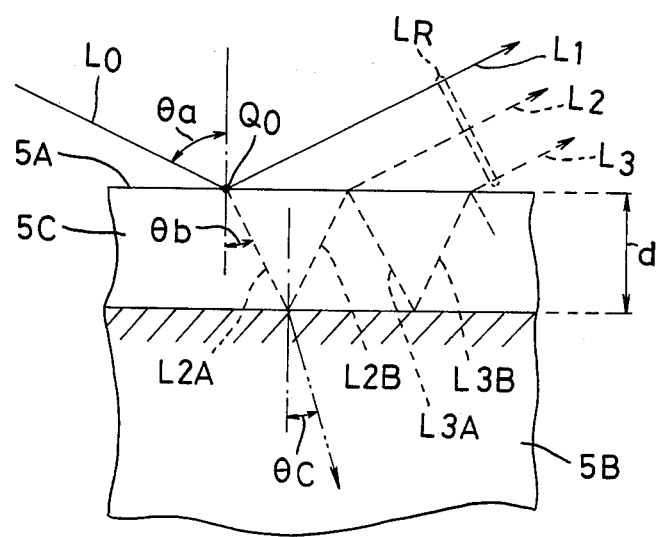
FIG. 5 is a sectional view used to explain interference between the reflected light rays on the surface to be detected shown in FIG. 1.

Next, let, us consider the case in which a thin photoresist film 5C is coated over the surface 5A or the surface to be detected of the semiconductor substrate 5B of the semiconductor wafer 5 as shown in FIG. 5. When the projection light beam LO is projected at a position Qo on the surface 5A of the thin photoresist film 5C at the angle of incidence $\theta_a$, part of the projection light beam LO is reflected as indicated by L1 and the light beam L2A which is refracted at an angle of $\theta_b$ and transmitted through the thin photoresist film 5C is reflected by the surface of the semiconductor substrate 5B. The reflected light beam L2B reflected from the surface of the semiconductor substrate 5B is refracted again at the surface 5A and emitted therefrom as the interior reflected light beam L2.

In like manner, of the light rays L2B reflected from the surface of the substrate, the third, fourth, . . . , and the n-th internally reflected light rays L3, L4 and so on based on the interior reflected light ray 3A which cannot be transmitted through the surface 5A and is internally reflected from the inner surface of the surface 5A again are emitted through the surface 5A and combined with the first reflected light L1 so that they reach as the reflected light LR the light receiving slit 6.

The ratio; that is, the index of (amplitude) refraction R between the sum of all reflected rays produced by the multiple reflections at the outer and inner surfaces of the thin photoresist film 5C and the projection light beam LO is expressed by the following equation:

$$R = \frac{r_{ab} + r_{bc} \cdot e^{jk}}{1 + r_{ab} \cdot r_{bc} \cdot e^{jk}} \quad (3)$$

where $r_{ab}$ is the reflectivity of the projection light at the boundary between the air and the thin photoresist film 5C; $r_{bc}$ is the reflectivity of the light beam transmitted through the thin photoresist film 5C and projected on the surface of the semiconductor substrate 5B; and k represents the difference in optical path between the light beam reflected by the surface of the thin photoresist film 5C and the light beam reflected from the surface of the semiconductor substrate 5B.

The reflectivity R expressed by Eq. (3) is represented by a complex number representative of a magnitude and a direction. The difference in optical path k is expressed by $$K = \frac{4\pi}{\lambda} \cdot n_b \cdot d \cdot \cos\theta_b \quad (4)$$

where $\lambda$ is the wavelength of the projected light LO, $n_b$ is the index of refraction of the thin photoresist film 5C; d is the thickness thereof; and $\theta_b$ is the angle of refraction of the transmitted light beam L2A. However, the quantity detected by the sensor unit 10 is the intensity of light so that reflectivity must be converted into reflectivity of energy. In this case, the energy reflectivity r is a square of an absolute value of an amplitude reflectivity R; that is, $$\begin{aligned} r &= R \cdot \overline{R} \\ &= 1 + \frac{r_{ab}^2 + r_{bc}^2 - 1 - (r_{ab} \cdot r_{bc})^2}{1 + (r_{ab} \cdot r_{bc})^2 + 2 \cdot r_{ab} \cdot r_{bc} \cdot \cos k} \end{aligned} \quad (5)$$

where $r_{ab}$ and $r_{bc}$ are expressed as real numbers because it is considered that the absorption of light by the thin photoresist film 5C and the semiconductor substrate 5B is less.

Eq. (5) which expresses the energy reflectivity of the internally reflected light beam L2 has the term of cos k in the demominator so that it is found out that when the difference k in optical path between the light beam L1 reflected from the surface of the thin photoresist film 5C and the light beam L2 reflected from the surface of the substrate 5B is varied, the energy reflectivity r is varied at a period of $2\pi/k$ correspondingly. However, the difference in optical path k is varied in response to the variations in thickness of the thin photoresist film 5C, it is found out from Eq. (4) that the energy reflectivity r is repeatedly varied as the thickness $d_x$ expressed by the following equation is varied:

$$d_x = \frac{\lambda}{2 \cdot n_b \cdot \cos\theta_b} \quad (6)$$

As described above, due to interference between the surface reflected light beam L1 and the internally reflected light beam L2, the energy reflectivity varies periodically in intensity in response to the variation in thickness d of the thin photoresist film 5C.

In the case of the investigation of the projection of the projection light having a wide angle of opening N.A. in the widthwise direction of the slit as shown in FIG. 1 is made which the above-described interference is taken into consideration, it considered that, as shown in FIG. 6, it is considered that there exists a difference in interference on the surface 5A or the surface to be detected between the projection light beam R1 having the greatest projection angle $\theta_1$ and the projection light beam R2 having the least projection angle $\theta_2$ among the projection light beam LO due to the difference between the projection angles $\theta_1$ and $\theta_2$. That is, in the case of the projection light ray R1 having the greatest projection angle $\theta_1$, the difference in optical path k between the surface reflected light beam L1 and the internally reflected light beam L2 becomes minimum (See Eq. (4)). On the other hand, in the case of the projection light beam R having the smallest projection angle $\theta_2$, the difference in optical path between the surface reflected light beam L1 and the internally reflected light beam L2 becomes maximum.

As a result, the thickness $d_x$ of the thin photoresist film 5 required to cause the variation of one period of the energy reflectivity of the first projection light beam R1 becomes considerably greater than the thickness $d_x$ of thin photoresist film 5C upon which is incident the second projection light beam R2 at the smallest projection angle $\theta_2$. Thus, when the thickness d of the thin photoresist film 5C varies, the ratio in intensity between the reflected light rays R1r and R2r contained in the surface reflected light beam L1 reflected from the surface 5A is varied correspondingly.

So far the relationship between the projection light ray R1 having the greatest angle of projection $\theta_1$ and the projection light ray R2 having the smallest projection angle $\theta_2$ has been described and the similar relationship also applies to the projection light rays distributed within a predetermined range of the angle of opening N.A. As a consequence, as shown in FIG. 6, the reflected light beam LR is de-focused at the surface of the light-receiving slit 6, the position $y_d$ detected by the sensor unit 10 has an error in response to the thickness d of the thin photoresist film because the reasons to be described below.

That is, the sensor unit 10 detects the position of the center of gravity of the quantity of light from the slit image focused on the light-receiving slit 6, but when the de-focused slit image is incident on the light-receiving slit 6 and the ratios in intensity among the light rays of the incident light beam are varied, the center of gravity of the amount of light detected by the sensor unit 10 is varied.

Such phenomenon was simulated by using the following numerical data. That is, the angle of opening N. A. was 0.1; the angle of projection $\theta_0$ of the projection light beam LO was 70°; the index of refraction $n_b$ of the thin photoresist film 5C was 1.64; the index of refraction $n_c$ of the semiconductor substrate 5B was 3.71. The results were that the energy reflectivity of the first projection light beam R1 as indicated by the solid line $C_{R1}$ in FIG. 7 and the energy reflectivity of the second projection light beam R2 indicated by the broken lines show the tendency that the relative variation in energy reflectivity is gradually deviated with increase in thickness d of the thin photoresist film 5C. Therefore, when the thickness d of the thin photoresist film 5C is selected as 1.1 micrometers as shown in FIG. 7, for instance, the energy reflectivities of the first and second projection light beams R1 and R2 are substantially equal to each other and become maximum, but when the thickness d is increased to 1.2 micrometers the variation in energy reflectivity of the first projection light beam R1 is less and the energy reflectivity r remains at a maximum value, but the energy reflectivity r of the second projection light beam R2 suddenly drops. This shows that the slit image is de-focused on the light-receiving slit 6, the ratio in intensity between the first and second reflected light beams R1r and R2r is varied extremely.

Such variation in turn causes the variation in distribution of intensity I of light on the light-receiving slit 6. That is, when the thickness d is 1.5 micrometers, the distribution of intensity I of light in the direction y on the light receiving slit 6 is not so greatly deviated as shown in FIG. 8A so that it can be determined that the detected position $y_d$ (the center of gravity of the amount of light of the slit image) is located substantially at the center of the de-focused slit image in the light-receiving slit.

On the other hand, when the thickness d of the thin photoresist film 5C becomes 1.2 micrometers as shown in FIG. 8B, the resulting intensity distribution is so deviated that the first reflected light beam R1r is by far stronger than the second reflected light beam R2r so that it is determined that the detected position $y_d$ of the center of gravity of the amount of light of the slit image is deviated toward the first reflected light beam R1r.

As a result, the detected position $y_d$ on the light receiving slit has an error which varies in response to the thickness d of the thin photoresist film 5C.

Such errors introduced in response to the variations in thickness d can be reduced to minimum when the angle of opening N.A. of the reflected light beam LR incident on the light-receiving slit 6 in the optical system as shown in FIG. 1 is narrowed by the stop 9 for controlling the angle of opening.

That is, as described above with reference to FIG. 7, the deviation between the curve $C_{R1}$ representing the variations in the energy reflectivity r of the first reflected light beam R1r and the curve $C_{R2}$ representative of the variations in the energy reflectivity r of the second reflected light beam R2r in response to the variations in thickness d becomes smaller as the angles of refraction $\theta_b$ of the first and second projection light beams R1 and R2 become equal to each other as described above with reference to Eq. (6). As a result, the deviation of the intensity distribution of the slit image focused on the light-receiving slit 6 described above with reference to FIG. 8B can be reduced by narrowing the angle of opening N.A. in the widthwise direction of the slit of the reflected light beam to a small value by the stop 9 for controlling the angle of opening.

Next the mode of operation of the stop 9 for controlling the angle of opening will be described in detail below. As described above, when a defocused slit image is formed on the light-receiving slit 6, the distribution of intensity of the slit image periodically varies in response to the variations in thickness d of the thin photoresist film 5C which is a surface to be detected so that the position of the center of gravity of the amount of light; that is the detected position $y_d$ vary.

When the reflected light rays R1r and R2r converges at one point on the light-receiving slit 6 so that the slit image is sharply focused on the light-receiving slit 6, such variations will not occur. However, in the defocused state or in the case of the so-called front focus in which the light-receiving slit 6 is located at a position behind a focal point and in the case of the de-focused state or in the case of rear focus in which the light-receiving slit 6 is located at a position in front of a focal point, the distribution of intensity of light is reversed so that the position of the center of gravity of the amount of light; that is the detected position $y_d$ is deviated in the opposite direction. It follows therefore that in order to obtain the detection result with a high degree of accuracy, the adjustment of the optical system must be made precisely so that a slit image can be sharply focused on the light-receiving slit 6.

For instance, when the slit image is sharply focused on the light-receiving slit 6 under the conditions that the index of refraction $n_R$ of the thin photoresist film is 1.64+0.002i; the index of refraction $n_s$ of the semiconductor substrate 5B is 3.71+0.01i; the wavelength $\lambda$ of light emitted from the light source 1 is 740 nm; the angle of opening N.A. of the reflected light beam LR is 0.1 and the angle of projection $\theta_a$ of the projection light LO is 70°, the intensity of light H11 (indicated by the broken lines) on the sensor element 8 varies periodically as the thickness d of the thin photoresist film 5C is increased as shown in FIG. 9A while the apparent deviation K11 (indicated by the solid line) of the surface to be detected corresponding to the deviation Z of the detection position $y_d$ from the reference position $y_o$ is gradually increased. In this case, because of the influence caused by interference between the light rays reflected from the surface of the thin photoresist film on the surface to be detected 5 and the light rays reflected from the surface of the semiconductor substrate, the deviation K11 exhibits the so-called "thorn" variations whenever the intensity of light drops by 0.1 micrometer.

On the other hand, when the slit image of the reflected light beam LR is defocused on the light-receiving slit 6 in the so-called rear focus state, the apparent deviation K12 of the surface to be detected corresponding to the deviation of the detected position $y_d$ in response to the variation H12 of intensity of light is remarkably directed in the positive direction. This means that the apparent surface to be detected corresponding to the detected position $y_d$ is located upwardly of the actual surface Zo to be detected as shown in FIG. 9B. This is extremely unreasonable. When the slit image is defocused on the light-receiving slit 6 in the so-called front focus state, the deviation K13 of the apparent surface corresponding to the detected position $y_d$ in response to the variations in intensity of light H13 is remarkably directed or extended in the negative direction as compared with the case when the slit image is sharply focused on the light-receiving slit (FIG. 9A) and varies over a wide range. This means that there is a large error.

As described above, when the slit image of the reflected light beam LR is defocused, an extremely large error is most likely to occur. Therefore, in order to eliminate such a great error so as to obtain the detection result with a high degree of accuracy, a degree of defocusing from the sharply focused state must be restricted about less than one-fourth of the depth of field.

The depth of field $\Delta F$ is defined as follows:

$$\Delta F = \frac{\lambda}{2 \cdot N.A.^2} \quad (7)$$

and the deviations of the apparent surfaces K12 and K13 shown in FIGS. 9B and 9C were obtained when the focal point was deviated twice the depth of field. That is, they show the deviations of the apparent surfaces when $\lambda=740$ nm; and N.A.=0.1 and the focal point was deviated by 74 micrometers in terms of the surface to be detected.

As is apparent from FIGS. 9A, 9B and 9C, depending upon whether the slit image is sharply focused or not on the light-receiving slit 6, the position of the apparent surface to be detected obtained in response to the detected position $y_d$ is greatly influenced so that the very delicate and precise adjustment of the optical system shown in FIG. 1 is required so as to attain the sharply focused image on the light-receiving slit. Especially when the objective lens 4B (or 4A) has a wider angle of opening N.A. and a small depth of focus, it is extremely difficult to adjust the optical system so that the slit image is focused within one-fourth of the depth of focus.

This problem can be effectively overcomed by the optical system shown in FIG. 1 in which the stop 9 for controlling the angle of opening is rotated through 90° as described above with reference to FIGS. 3 and 4. That is, in the case of the adjustment of the focal point of the optical system, the stop 9 for controlling the aperture angle is rotated and brought to th position as shown in FIG. 4 so that the direction of the width $W_L$ of the opening 9A of the stop 9 for controlling the angle of opening becomes perpendicular to the width $W_{SL}$ of the slit image while the longitudinal direction of the opening 9A coincides with the widthwise direction of the slit image. As a result, the aperture width $W_L$ will not limit the angle of opening in the widthwise direction of the slit image. Since the angle of opening N.A. of the slit image focused on the light-receiving slit 6 is not limited and therefore is widened, the depth of focus $\Delta F$ defined by Eq. (7) can be decreased in inverse proportion of the square of the angle of opening N.A. Thus, the focal point adjustment of the optical system as shown in FIG. 1 can be made with a high degree of accuracy.

When the stop 9 for controlling the angle of opening is rotated through 90° so that the width $W_{SL}$ of the slit image is restricted, the angle of opening N.A. of the reflected light beam L1 can be narrowed and consequently the detected position $y_d$ can be determined with a minimum error as described above.

For instance, in the case of the adjustment of the focal point, the width Wv in the longitudinal direction of the opening 9A is so selected that the angle of opening N.A. becomes 0.1 and in the case of the detection of the position, the aperture width $W_L$ is so selected that the angle of opening N.A. becomes 0.025.

Therefore, in the case of the adjustment of the focal point (N.A.=0.1), the depth of focus $\Delta F$ defined by Eq. (7) becomes 37 micrometers when $\lambda=740$ nm while in the case of the detection of the position of the surface (N.A.=0.025), the depth of focus $\Delta F$ becomes 592 micrometers. When the focal point is selected within two times the depth of focus or 74 micrometers in the case of the focal point adjustment (N.A.=0.1) under these conditions, the focal point is adjusted within ⅛ of the depth of focus in the surface position detection mode (N.A.=0.025). As a result, it becomes possible to eliminate the influence of out-of-focus due to de-focusing.

Therefore, the stop 9 for controlling the angle of opening may be detachably inserted into the optical system and located at the position shown in FIG. 1 so that it may be removed in the case of the adjustment of the optical system, but when the opening 9A of the stop 9 for controlling the angle of opening is designed and constructed as shown in FIGS. 3 and 4, it becomes possible to supply a practically sufficient amount of light to the sensor unit 10 when the angle of opening N.A. is limited in the surface position detection mode, whereby the out-of-focus state can be inspected at any time.

Figure 10:
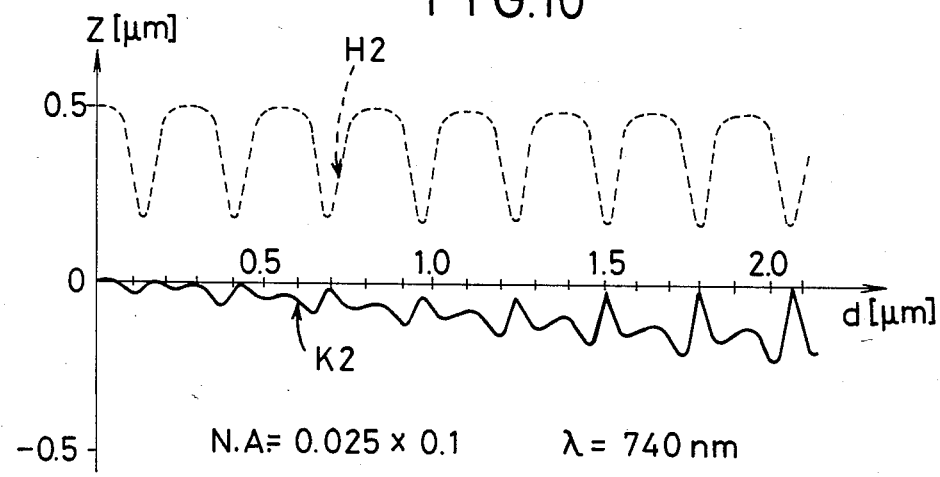
FIG. 10 shows the characteristic curves illustrating the deviation in the detection of the surface with respect to the thickness of the photoresist film when the stop for controlling the angle of opening is switched to the position detection mode (N.A.=0.025) as shown in FIG. 3 and a slit image is de-focused on the surface of the sensor in the rear focus state.

FIG. 10 shows the deviation K2 of the detected position $y_d$ in response to the variations H2 in intensity of light on the sensor element 8 when the stop 9 for controlling the angle of opening as shown in FIGS. 3 and 4 was used; a degree of de-focusing was selected 74 micrometers in the front focus state as in the case of FIG. 9C; the wavelength $\lambda$ of light emitted from the light source 1 was 740 nm; the angle of opening N.A. due to the aperture width $W_L$ of the opening 9A was 0.025; and the angle of opening N.A. defined by the with Wv in the longitudinal direction was 0.1. It is seen that even though in the de-focused state, the curve which is represent the variations in position and is substantially similar to the curve K1 obtained in the case of the formation of the sharply focused image as shown in FIG. 9A can be obtained. As compared with FIG. 9C, it becomes possible to obtain the position detection output with an error which can be almost neglected in practice.

In the first embodiment shown in FIG. 1, the stop 9 for controlling the angle of opening is disposed on the side of the reflected light beam LR, but the same effects can be attained even when the stop 9 is disposed at a position of a pupil $E_1$ on the projection light side.

In the first embodiment shown in FIG. 1, the stop 9 for limiting the angle of opening N.A. in the widthwise direction of the slit image formed by the reflected light beam LR (or the projection light beam LO) is provided in order to reduce the adverse effects caused by interference on the surface 5A to be detected by the monochromatic light rays emitted from the light source 1, but when a light source capable of emitting multicolor light rays which hardly interfer with each other is used instead of the stop 9 for controlling the angle of opening, the present invention can provide a surface displacement sensor capable of sensing the displacement of the surface at a high degree of accuracy without being adversely affected by interference.

Figure 11:
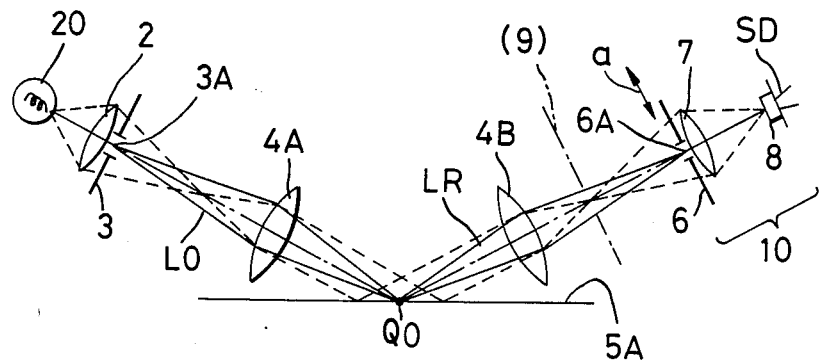
FIG. 11 is a schematic view of an optical system of a second embodiment of the present invention in which a multi-color light source is used as a light source.

FIG. 11 shows the construction of the optical system of a second embodiment or an oblique incidence type surface displacement sensor using a multicolor light source in accordance with the present invention. Same reference numerals are used to designate similar parts in both of FIGS. 1 and 11 and the component parts which have been already explained with reference to FIG. 1 shall not be described in detail in the second embodiment.

In FIG. 11, a light source 20 comprises a white lamp such as a halogen lamp capable of emitting multicolor projection light rays. The projection light beam LO emitted from the multicolor light source 20 is converged by a condensor lens to illuminate the slit-shaped opening 3A of the slit 3 so that the image of the slit-shaped opening 3A is focused on the surface (the surface to be detected) of the semiconductor wafer 5 at Qo through the objective lens 4A on the side of the projection light beam. The reflected light beam LR re-focuses the slit image on the light receiving slit 6 through the objective lens 4B on the light receiving side. The light rays which have passed through the opening 6A of the light-receiving slit 6 is converged throug the collector lens 7 on the sensor element 8 comprising a photoelectric transducer. The light-receiving slit 6, the collector lens 7 and the sensor element 8 constitute the sensor unit 10 and the light-receiving slit 6 is so designed and constructed as to oscillate in the directions indicated by the double-pointed arrow a and the longitudinal direction of the slit opening 6A is perpendicular to FIG. 11 so that it coincides with the longitudinal direction of the slit opening 3A on the projection light side (or in the light projection space).

As in the case of the first embodiment as shown in FIG. 1, the object lenses 4A and 4B are so positioned that when the surface 5A of the semiconductor wafer 5 is located at a reference position or height Zo as indicated by the solid line in FIG. 2, the reflected light beam L1 is incident at a reference position Po of the light-receiving slit 6. While the reflected light beam L1 is incident at the reference position Po, the light-receiving slit 6 is caused to oscillate at a period T with the reference position Po being the center of oscillation so that the sinusoidal waveform detection output SD is derived at a period $\frac{1}{2}$T and consequently the. position of the surface 5A of the semiconductor wafer 5; that is, the surface to be detected, can be detected in response to the detection output derived from the sensor element 8.

For instance, when the surface 5A of the semiconductor 5 is displaced downwardly by a distance $\Delta Z$ as indicated by the broken lines in FIG. 2, the displacement $\Delta y$ of the position $P_1$ displaced from the reference position Po on the light-receiving slit can be obtained from Eq. (1).

It follows therefore that when the position displacement $\Delta y$ on the light-receiving slit 6 is detected in response to the detection output SD derived from the sensor element 7, the displacement $\Delta Z$ of the surface 5A of the semiconductor wafer 5 can be obtained from Eq. (1).

Now it is assumed that a light source capable of emitting coherent monochromatic rays be used. Then, there arises the problem that interference between reflected light rays occurs so that the position on the light-receiving slit 6 at which the reflected light beams LR is incident cannot be detected correctly.

Figure 12:
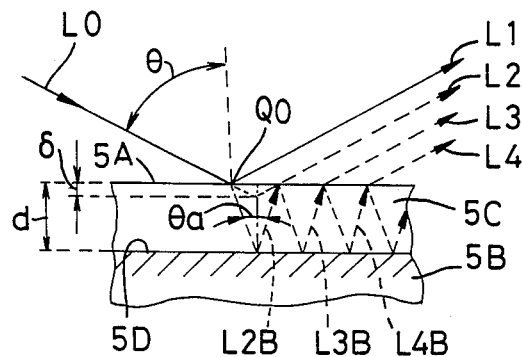
FIG. 12 is a cross sectional view used to explain the incident beam and the reflected beam.

For instance, when the surface 5A of the semiconductor wafer 5 is the surface of the thin film 5C coated over the surface of the semiconductor substrate 5B as shown in FIG. 12, a portion of the projection light LO incident at the point Qo on the surface 5A of the thin film 5C is reflected as a surface reflected light beam L1 while the other portion is transmitted through the thin film 5C and is reflected by the surface of the semiconductor substrate 5B as indicated by L2B which in turn is refracted through the surface 5A to the exterior as a second internally reflected light beam L2. A portion of the reflected light ray 2B is reflected back by the surface 5A to the surface of the semiconductor substrate 5B and then reflected again and refracted through the surface 5A, forming the third internally reflected light rays L3. In like manner, the internally reflected light rays L4 and so on are emitted. The surface reflected light ray L1 and the internally reflected light rays L2, L3, L4 and so on reach the light-receiving slit 6.

These surface and internally reflected light rays are further investigated. The internally reflected light ray L2 is considered to be reflected only one time at a position at a depth of $\delta$ from the apparent surface 5A so that it is focused on the light-receiving slit 6, but is displaced laterally with respect to the position at which the surface reflected light ray L1 is incident by a distance $\epsilon$ expressed by $$\epsilon = 2 \cdot \beta \cdot \delta \cdot \sin \theta \tag{8}$$

In this case, the apparent displacement o of the surface 5A is expressed by $$\delta = \frac{d \cdot \cos\theta}{\sqrt{n^2 - \sin\theta}} \tag{9}$$

where d is the thickness of the thin film 5C and n is the index of refraction thereof.

Eq. (9) represents the above-described displacement of the light ray reflected by the surface of the semiconductor substrate 5B only one time and the light rays L3, L4, ..., and L(m+1)A which are reflected by the surface of the semiconductor substrate 5B more than two times are also displaced from the reference incidence position on the light-receiving slit 6 at which is incident the surface reflected light ray L1 by 2$\epsilon$, 3$\epsilon$, ... and m$\epsilon$.

If these reflected light rays are monochromatic or quasi-monochromatic, they interfere with each other due to the conditions of the optical system and the thickness of the thin film 5C so that the image focused on the light-receiving slit 6 is deformed. As a result, the center of gravity of the amount of light detected by the sensor unit 10 is displaced so that an error is introduced into the result of the detection of the position displacement $\Delta y$ in response to the surface reflected light ray L1.

Figure 13:
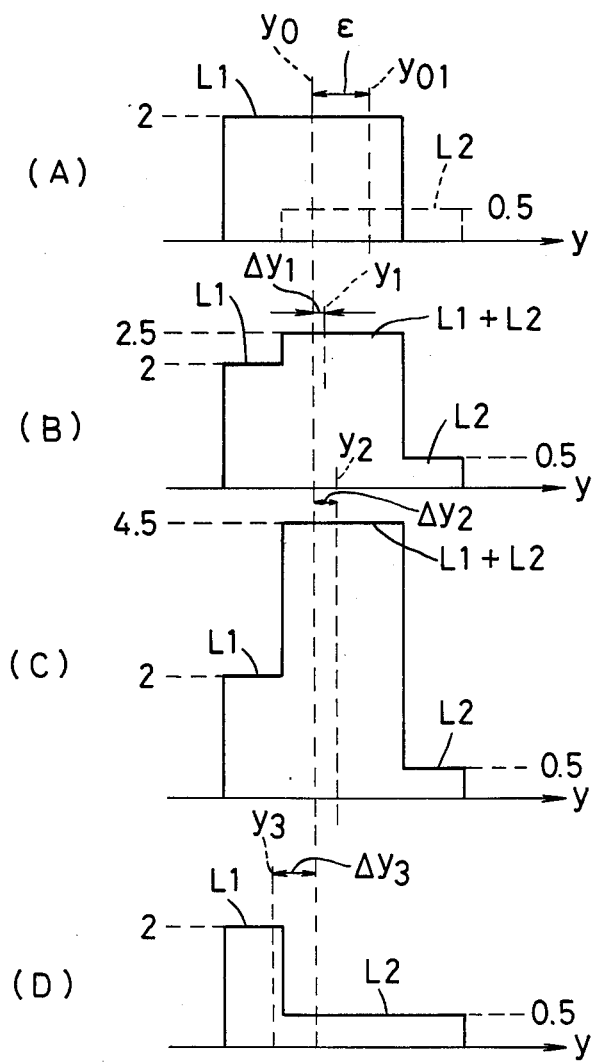
FIG. 13 is a view used to explain the displacement of the center of gravity of the quantity of light caused by the interference effect of reflected light rays on the surface to be detected.

The above-described phenomenon will be qualitatively analyzed below with reference to FIG. 13.

First it is assumed that when only the surface reflected light ray L1 is incident on the light-receiving slit 6, the sensor unit 10 determines the center of gravity of the amount of light $y_o$ and when the internally reflected light L2 which is reflected only one time at the surface of the substrate 5B is incident on the-light-receiving slit 6, the sensor unit 10 determines the center of gravity of the amount of light $y_{01}$ which is spaced apart from the position $y_o$ by the distance $\epsilon$ (See Eq. (8)). It should be noted here that in FIG. 13, the intensity of the surface reflected light L1 is represented by 2 while the intensity of the light ray L2 reflected only one time by the surface of the substrate 5B is represented by 0.5.

When the light source 20 capable of emitting multicolor rays LO is used under the above-described conditions, no interference between the surface reflected light ray LO and the internally reflected light ray 2 will occur. As a result, as shown in FIG. 13(B), the image focused on the light-receiving slit 6 has the distribution of intensity of light ($L_1 + L_2$) which is the sum of the distribution of intensity of the surface reflected light L1 shown by the solid lines in FIG. 13(A) and the distribution of intensity of the internally reflected light ray L2 shown by the broken lines in FIG. 1(A). As a result, the center of gravity $y_o$ (See FIG. 13(A)) of the surface reflected light ray L1 shown in FIG. 3 is displaced to the position $y_1$ which is displaced from the center of gravity $y_o$ by a very small displacement $\Delta y_1$.

On the other hand, when a light source emitting a coherent light beam is used, the center of gravity of the amount of light focused on the light-receiving slit 6 is displaced from the center of gravity of the surface reflected light ray L1 $y_o$ by a large distance because of the deformations of the image focused on the light-receiving slit 6 caused by interference fringes resulting from interference between the surface reflected light ray L1 and the internally reflected light ray L2. For instance, when interference between the surface reflected light ray L1 and the internally reflected light ray L2 becomes maximum, the intensity of light at an interference portion L1+L2 is increased extremely as shown in FIG. 13(C). (For instance, while the intensity of the surface reflected light ray L1 is 2, the light intensity due to interference rises as high as 4.5). As a result, the center of gravity of the amount of light of the image focused on the light-receiving slit 6 is displaced to the position $y_2$ by a greater displacement $\Delta y_2$ as compared with the case of FIG. 13(B). On the other hand, when a degree of interference is minimum, the surface reflected light ray L1 is eliminated in the range in which the internally reflected light ray L2 and the surface reflected light ray L1 are superimposed one upon another as shown in FIG. 13(D). As a result, the center of gravity of the amount of light of the image focused on the light-receiving slit 6 is extremely displaced to the position $y_3$ by a far greater position displacement $\Delta y_3$ from the center of gravity $y_o$ of the amount of surface reflected light ray L1.

As described above, when an incoherent light source 100 is used, the displacement of the center of gravity of the amount of light is very small and the center of gravity of the amount of light is substantially coincident with the center of gravity of the amount of the surface reflected light ray L1 as shown in FIG. 13(B), but when a coherent light source is used, the center of gravity of the amount of light of the image focused on the light-receiving slit 6 is extremely displaced from the position $y_o$ due to interference between the surface reflected light ray L1 and the internally reflected light ray L2 which is reflected only one time from the surface of the substrate. As a consequence, a large error is introduced into the result of detection obtained by the sensor unit 10.

When interference between the surface reflected light ray L1 and the internally reflected light ray L2 occurs, depending on the thickness d of the thin film 5C, the intensity H of the superimposed light rays is represented by $$H = H_1 + H_2 + 2\sqrt{H_1 \cdot H_2} \cdot \cos\gamma \tag{10}$$

That is, the intensity H is dependent upon the intensity $H_1$ of the surface reflected light ray L1 and the intensity $H_2$ of the internally reflected light ray L2 and the difference in phase $\gamma$ between these two reflected light rays. Especially when the difference in phase $\gamma$ between the reflected light rays L1 and L2A is $2k\pi$ (where K is an integer), the reflected light rays L1 and L2 are intensified most so that the resultant intensity becomes maximum as described above with reference to FIG. 13(C). On the other hand, when the phase difference $\gamma = (2k-1)\pi$, the reflected light rays L1 and L2 are attenuated most as described above with reference to FIG. 13 (D).

Figure 14:
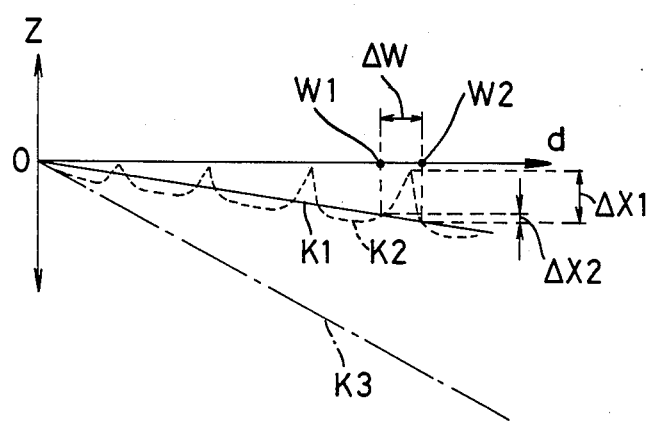
FIG. 14 is a diagram used to explain the deviations in the detection of the surface to be detected due to interference of reflected light which varies depending upon the thickness of a thin transparent film over the surface to be detected.

Meanwhile, the phenomenon that the positions of the reflected light rays L1 and L2 are moved away from each other as the thickness d the thin film 5C is increased is observed and can be illustrated as shown in FIG. 14 when the detected positions in response to the variations in thickness d of the thin film 5C are represented with respect the reference position Zo on the surface of the thin film 5C shown in FIG. 2. (This means that the image focused by the reflected light ray L1 is made stationary in FIG. 13). When an incoherent light source is used, no interference between the reflected lights L1 and L2 occurs as described above with reference to FIG. 13(B) so that in response to the increase in thickness d of the thin film 5C, the apparent detected positions of the surface to be detected is linearly displaced downwardly as indicated by the solid line K2 in FIG. 14. This phenomenon shows that since the internally reflected light ray L2 is displaced toward the right as the thickness d of the thin film 5C is increased, the center of gravity of the superimposed reflected light rays is also displaced toward the right correspondingly.

When a coherent light source is used as described above with reference to FIGS. 13(C) and (D), the phenomenon that as the thickness d of the thin film 5C is increased, the apparent detected positions of the surface to be detected is varied due to the interference effect as indicated by the broken lines 2 in FIG. 14 is observed. In this case, in addition to the phenomenon that as the thickness d of the thin film 5C is increased, the position of the internally reflected light ray L2 is deviated toward the right, there exists a phenomenon that when the phase difference between the reflected light rays L1 and L2 which varies in response to the variations in thickness d becomes $(2k-1)\pi$, the destructive interference in which the portion at which the reflected light rays L1 and L2 are superimposed one upon another is most attenuated results so that the center of gravity of the amount of light of the whole image focused on the light-receiving slit 6 is considerably deviated to the left in FIG. 13(D). As a result, the apparent detected positions of the surface to be detected varies widely upwardly and downward as indicated by the curve K2 due to the external disturbance or interference effect. In FIG. 14, the one-dot chain line K3 indicates the position of the surface 5D of the substrate.

When the apparent detected position is varied as described above and, for instance, when the thickness d of the thin film 5C is varied in the range $\Delta W = W_1 - W_2$ (See FIG. 14) in the process of coating a thin film over the surface of substrate, the result of the detection of the apparent detected position of the surface to be detected varies widely in a range with the maximum variation of $\Delta X_1$ as indicated by the curve K2 in FIG. 14. When the position displacement $\Delta y$ (See FIG. 2) is detected in response to such detection results which vary over a wide range as described above, a great error is introduced into the result of detection made in response to the position displacement $\Delta y$.

On the other hand, the apparent detected positions of the surface to be detected is caused to linearly vary in response to the thickness d of the thin film 5C as indicated by the solid line K1 in FIG. 14, the range $\Delta X_2$ of variations in the detected position with respect to the variation $\Delta W$ in the thickness d of the thin film 5C can be considerably decreased so that the errors of the results of the apparent detected positions detected in terms of the position displacement $\Delta y$ on the light-receiving slit 6. It follows therefore that when the multicolor light source is used in FIG. 11, the reflected light rays will not interfere with each other so that a detection error due to interference can be eliminated.

Figure 15:
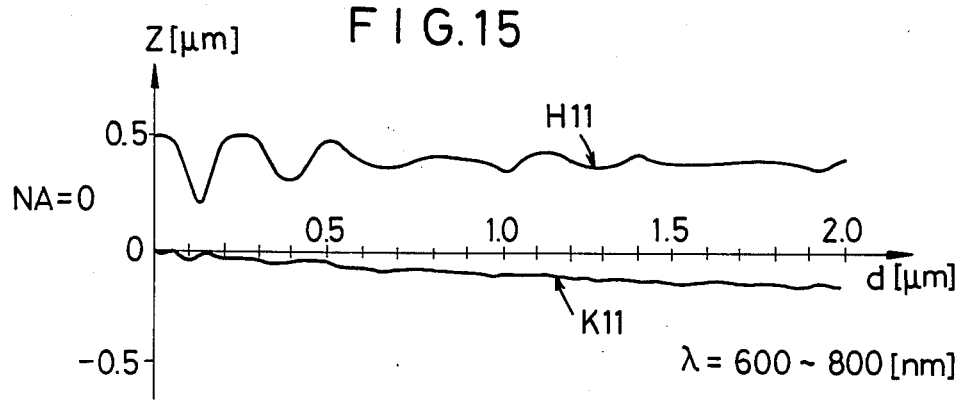
FIG. 15 shows the characteristic curves illustrating variations in the intensity of reflected light rays and in the displacement of the surface to be detected with respect to the thickness of a thin film coated over the surface to be detected when a point source (N.A.=0) capable of emitting light rays having various wavelengths is used as a light source in the second embodiment shown in FIG. 11.

FIG. 15 shows the results of the quantative numerical computations. That is, the bundle of light rays at the wavelength between 600 and 800 nm is projected from a point source (N.A.=0) 20 in the embodiment shown in FIG. 11 through the objective lens with N.A.=0.3 at an angle of projection $\theta = 70°$ on the surface 5A of the semiconductor wafer 5 consisting of the silicon substrate 5B (with the complex index of refraction $n_s = 3.71 + 0.01i$) and the photoresist film 5C (with the complex index of refraction $n_R = 1.64 + 0.002i$), the deviation of the apparent detected positions from the surface in response to the variations in thickness d of the thin film 5C varies substantially linearly. In FIG. 15, the curve H11 represents the intensity of light at the light-receiving slit 6.

Figure 16:
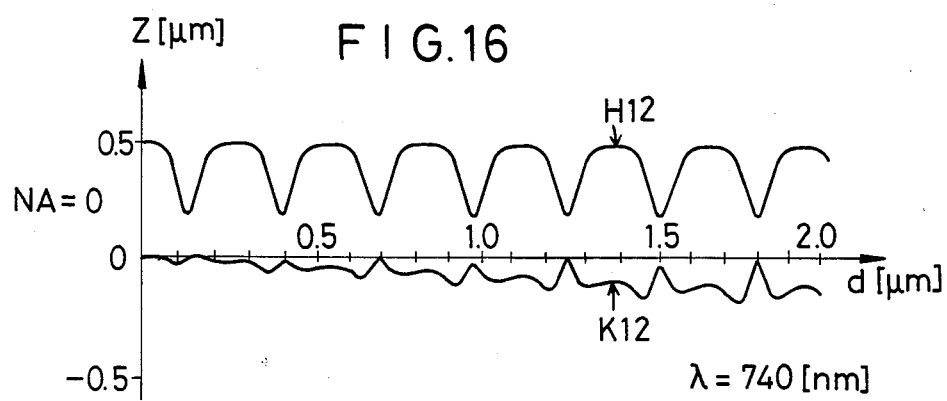
FIG. 16 shows the characteristic curves illustrating the variations in intensity of reflected light and in deviation in detection of the surface to be detected in response to the variation in the thickness of the thin films when a monochromatic light source is used as a light source in the second embodiment shown in FIG. 11 as in the cases of the conventional surface displacement sensors.

On the other hand, like the conventional surface displacement sensors, when a coherent light source emitting a monochromatic detection light LO at a wavelength of 740 nm is used to illuminate the surface 5A under the condition that the numerical aperture N.A. of the illumination light is 0, the deviation from the surface is extremely adversely affected due to the interference effect as indicated by the curve K12 in FIG. 16 as compared with the case described above with reference to FIG. 15.

As described above, according to the second embodiment as shown in FIG. 11, when the surface displacement is detected by an oblique projection method, the light source 20 capable of multicolor projection light rays LO is used. Therefore, even when an optically transparent thin film such as a photoresist layer is coated over the surface 5A of the semiconductor wafer 5, the photoresist layer can effectively avoid interference of the reflected light ray L1 so that a degree of accuracy in the detection of the position displacement or deviation $\Delta y$ by the sensor unit 10 can be remarkably increased as compared with the conventional surface displacement sensors. As a result, a degree of accuracy in the detection of the displacement of the surface to be detected can be further improved.

Figure 17:
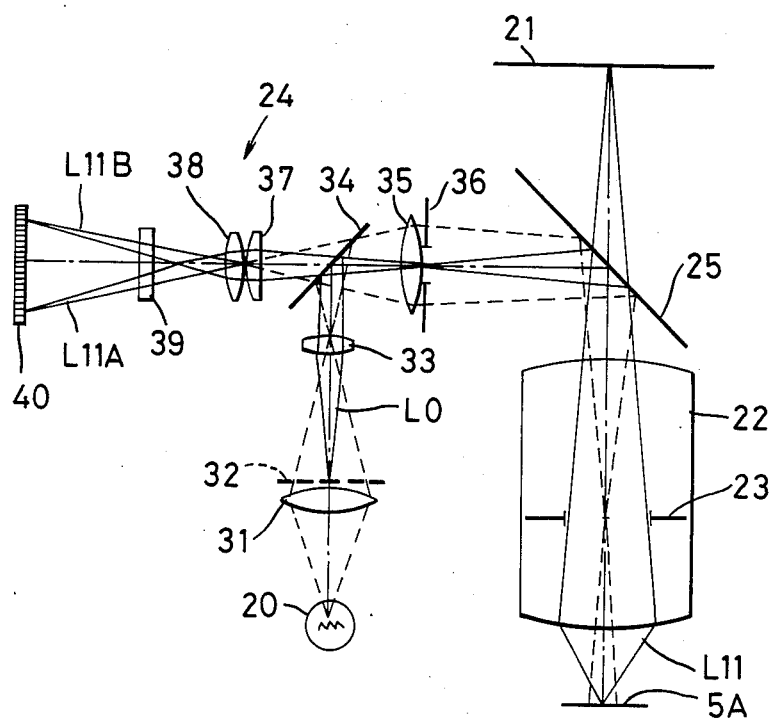
FIG. 17 shows the construction of an optical system of a third embodiment of the present invention incorporated in an projection and exposure device.

FIG. 17 shows a third embodiment of the present invention in which the detection light beam illuminates the semiconductor wafer thorugh the TTL (through the lens) system.

In a projection exposure device for use in the semiconductor device fabrication apparatus of the type in which a pattern image on a mask is focused through a pupil 23 of a projection lens 2 on the surface 5A of the wafer 5, a surface displacement sensor 24 is used to check whether or not the pattern image is sharply focused on the surface 5A.

The illumination system of the surface displacement sensor generally indicated by the reference numeral 24 is so designed and constructed that the projection light beam LO emitted from the light source 20 illuminates the surface 5A of the wafer 5 through a beam splitter 25 such as a half mirror interposed between the mask 21 and the projection lens 22 and through the projection lens 22. The multicolor projection light beam LO emitted from the light source 20 passes through a field lens 31 and illuminates a projection pattern 32. Thereafter the projection light beam LO focuses the image of the projection pattern on an aperture stop 36 through a relay lens 33, a beam splitter 34 consisting of a half-mirror and a field lens 35. The projection light beam LO is then refracted by the beam splitter 25 in the direction of the projection lens 22, whereby the image of the projection pattern is focused again through the projection lens 22 at a position adjacent to the surface 5A of the semiconductor wafer 5.

The multicolor reflected light beam L11 reflected back from the surface 5A of the semiconductor wafer 5 is focused on the aperture or field stop 36 through the projection lens 22 and the beam splitter 25. The image thus focused passes through the field lens 35 and the beam splitter 34 and is divided into two reflected light rays 11A and 11B by a pupil splitting prism 37. The reflected light rays L11A and L11B thus splitted are focused through a relay lens 38 and a light-receiving slit 39 on a sensor element 40 such as a linear sensor, respectively.

In the third embodiment shown in FIG. 17, the light source 20 is so positioned as to be in conjugated relationship with the pupil 23 of the projection lens 22 with respect to the field lenses 31 and 35 and the pupil splitting prism 37 is so positioned as to be in conjugated relationship with the pupil 22 of the projection lens 22 with respect to the field lens 35. Therefore, in response to the displacement in the optical axis of the projection lens 22 of the surface 5A of the semiconductor wafer 5, the relative distance between the points focused by the reflected light rays L11A and L11B splitted by the prism 37 varies so that the position of the surface 5A of the semiconductor wafer 5 can be detected by detecting by the sensor element 40 the distance between the points focused thereon by the reflected light rays L11A and L11B, respectively.

However, if the light source 20 is a coherent light source, interference between the surface reflected light ray; that is, the light ray reflected from the surface 5A of the semiconductor wafer 5 and the internally reflected light ray; that is, the light ray reflected back from the bottom surface of the thin film 5C and then refracted by the surface 5A into the air, results so that such interference causes the variations in the center of gravity of the amount of the reflected light rays L11A and L11B on the sensor element 40. However, according to the third embodiment of the present invention as shown in FIG. 17, the light source 20 capable of emitting the multicolor projection light beam is used so that, as in the case of the second embodiment described above with reference to FIG. 11, no interference will not occur at the surface 5A of the semiconductor wafer 5. Therefore, the points focused by the reflected light rays L11A and L11B, respectively, on the sensor element 40 can be detected with a higher degree of accuracy.

Figure 18:
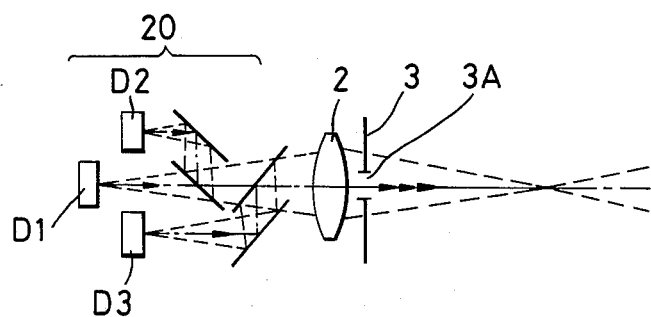
FIG. 18 is a schematic view of an embodiment of a multi-color light source composed of a plurality of light-emitting diodes.

In the third embodiment, the light source emitting the multicolor projection light beam LO is a halogen lamp, but it is to be understood that a plurality of LEDs (Light-Emitting Diodes) capable of emitting more than two different color light rays may be used as indicated by $D_1$, $D_2$ and $D_3$ (See FIG. 18).

In the first and second embodiments described above, in order to optically detect the slit image focused on the light-receiving slit 6, the collector lens 7 and the sensor element 8 are provided and the light-receiving slit 6, the collector lens 7 and the sensor element 8 constitute the sensor unit 10, but it is to be understood that instead of the sensor unit 10, a position sensor or a linear sensor may be directly disposed at the rectangular opening of the light-receiving slit 6 as a sensor unit 10 and that photocells may be arranged in a suitable pattern so that the slit image can be detected by processing an image obtained by the photocells.

Furthermore, in the first embodiment described above with reference to FIG. 1, the opening 9A substantially in the form of a rectangle described above with reference to FIGS. 3 and 4 is used to control the angle of opening N.A. in the widthwise direction of the slit of the reflected light ray LR so that the detected position deviation characteristic curve substantially similar to that obtained in the focused mode (See FIG. 9A) is obtained as shown in FIG. 10 by making the adjustment of the focal point within an allowable or tolerable adjustment range in practice.

However, when the characteristic curves as shown in FIG. 10 are further investigated in detail, it is found out that the variations in "the thorn-shaped" peaks produced whenever the intensity of light rises are relatively greater than those shown in FIG. 10 so that a degree of accuracy in detection is not satisfactory in practice.

In order to overcome this problem, in the first embodiment shown in FIG. 1, a light source capable of emitting a monochromatic light beam is used, but it is to be understood that a multicolor light source may be used. In the latter case, an optical system becomes substantially similar to that shown in FIG. 11 except that a stop 9 for controlling the angle of opening is detachably inserted at the position of a pupil of the optical system as indicated by the one-dot chain line in FIG. 11.

Figure 19:
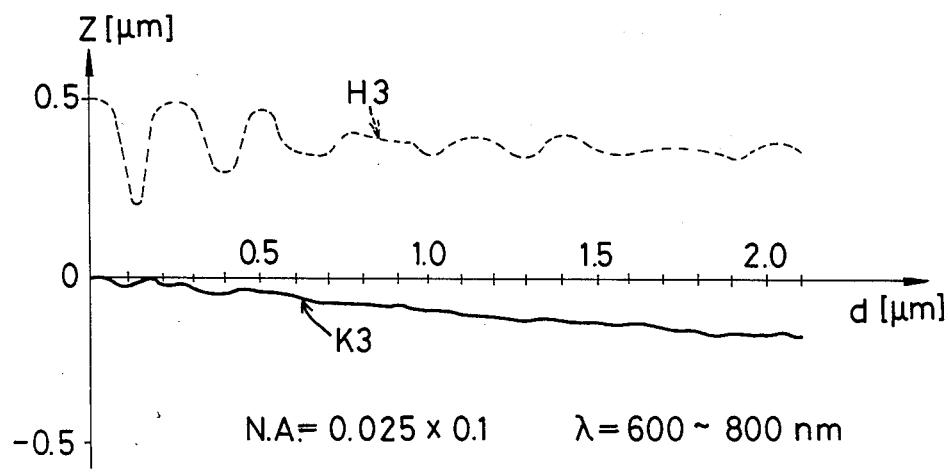
FIG. 19 shows characteristic curves of a third embodiment.

FIG. 19 shows the characteristic curves of the third embodiment in which the multicolor light source capable of emitting the light rays in the range of wavelength $\lambda$ between 600 and 800 nm is used as the light source 20 and the stop 9 for controlling the angle of opening is inserted at the position of the pupil of the optical system. When the multicolor light source 20 and the stop 9 for controlling the angle of opening are used, no interference occurs at the surface to be detected or the surface 5A and at the surface of the substrate 5 so that the variations in the intensity of light H3 in the sensor unit 10 can be reduced and consequently the position detection characteristic curve which varies linearly in response to the variations in thickness d of the thin photoresist film 5C can be obtained.

Thus the present invention can provide a surface displacement sensor having a very small error.

In the first embodiment, the slit width of the slit image narrowed so as to compensate for errors based on the fact that, as described above with reference to FIGS. 7 and 8, in response to the deviation in the distribution of the intensity of light caused when the reflected light beam LR forms a defocused slit image on the light-receiving slit 6, the center of gravity of the amount of light is deviated from the reference position $y_d$. However, a light source capable of multicolor light rays is used as the light source (See FIG. 1) as in the case of the third embodiment, the deviation of the distribution of the intensity of light in the defocused state can be relaxed or decreased.

As described above with reference to Eq. (6), a variation $d_x$ of the thickness d of the thin film 5C which causes a variation of one period of the energy reflectivity (See Eq. (4)) is in proportion to the wavelength $\lambda$. Therefore, instead of the light source 1, the light source 20 capable of multicolor light rays is used, the effect obtained by the superposition of the effects of many light components which cause the variations in energy reflectivity at various pitches can be introduced into the distribution of the intensity of light on the light-receiving slit 6. Therefore, when the light-receiving slit 6 is viewed as a whole, the extreme deviation of the distribution of the intensity of light can be substantially eliminated so that the detected position $y_d$ representative of the center of gravity of the amount of light is found substantially adjacent to the reference position.

We claim:

1. A surface displacement sensor of the type in which a light image having a predetermined pattern is projected on a surface to be detected having an optically transparent thin film and a deviation of the position of the light image re-focused by the reflected light beam from said surface to be detected is optoelectrically detected, thereby detecting the displacement of said surface to be detected, comprising:
   a radiation source capable of generating radiation rays;
   a member which has a predetermined-shaped opening and which is illuminated by the radiation beam from said radiation source;
   a radiation projection system which projects the radiation beam emitted from said radiation source and passed through said opening on said surface to be detected, thereby forming a first radiation image similar to said opening on said surface to be detected;
   a radiation receiving system for causing the reflected radiation beam reflected from said surface to be detected to re-focus a second radiation image;
   detection means for optoelectrically detecting the center of gravity of the amount of said second radiation image re-focused by said radiation receiving system; and
   means for controlling the angle of opening which is inserted in the path of said detection radiation beam so as to control the angle of opening of at least one radiation beam focusing said radiation image in a plane of incidence including a normal line perpendicular to said surface to be detected.

2. A surface displacement sensor as set forth in claim 1, wherein said means for controlling the angle of opening comprises stop means having a rectangular opening for passing the radiation beam and is located at the position of a pupil of a radiation detection system including said radiation projection system and said radiation or at its conjugate position.

3. A surface displacement sensor as set forth in claim 1, wherein said means for controlling the angle of opening comprises stop means which has a rectangular opening for passing the radiation beam and which is rotatable about the radiation axis, whereby in the case of the detection of the displacement of said surface to be detected, the widthwise direction perpendicular to the longitudinal direction of said opening becomes in parallel with said plane of incidence while in the case of the adjustment of the focal point in said radiation projection system and in said radiation receiving system, the widthwise direction of said opening becomes perpendicular to said plane of incidence.

4. A surface displacement sensor as set forth in claim 1, wherein said radiation source is a multicolor light source capable of generating light rays each having a different wavelength so that interference between reflected light rays reflected from said optically transparent thin film will not adversely affect the photoelectric detection of said detection means.

5. A surface displacement sensor of the type in which a light image having a predetermined pattern is projected on a surface to be detected having an optically transparent thin film and a deviation of the position of the light image re-focused by the reflected light beam from said surface to be detected is optoelectrically detected, thereby detecting the displacement of said surface to be detected, comprising:
   a multicolor light source capable of producing a detection light beam consisting of multicolor light rays each having a different wavelength;
   a member which has a predetermined-shaped opening and which is illuminated by said detection light beam from said multicolor light source;
   a projection optical system which projects the detection light beam emitted from said multicolor light source and passed through said opening on the surface to be detected, thereby forming a first light image similar to said opening thereon;
   a light receiving optical system which causes the light beam reflected from said surface to be detected to re-focus a second light image; and
   detection means for detecting the position of the center of gravity of the amount of light of said second light image re-focused by said light-receiving optical system.

6. A surface displacement sensor as set forth in claim 5, wherein said optical projection system and said light-receiving optical system are composed of a common single objective lens optical system; said multicolor light source is located at a position conjugate with the position of a pupil of said common single objective lens optical system; and said detection means comprises a pupil splitting prism which is located at a position conjugate with the position of a pupil of said common single objective lens optical system and a relay lens for causing the reflected light rays from said surface to be detected and splitted by said pupil splitting prism to re-focus images, respectively.

* * * * *